(12) United States Patent
Iwasaki et al.

(10) Patent No.: US 7,244,979 B2
(45) Date of Patent: Jul. 17, 2007

(54) SEMICONDUCTOR MEMORY DEVICE AND METHOD FOR MANUFACTURING THE SAME

(75) Inventors: Yukihiro Iwasaki, Suwa (JP); Tatsuo Sawasaki, Fujimi (JP); Kazumasa Hasegawa, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/311,841

(22) Filed: Dec. 19, 2005

(65) Prior Publication Data

US 2006/0138506 A1 Jun. 29, 2006

(30) Foreign Application Priority Data

Dec. 28, 2004 (JP) .............................. 2004-380990

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ...................................... 257/295; 257/110
(58) Field of Classification Search ................ 257/295, 257/310
See application file for complete search history.

(56) References Cited

U.S. PATENT DOCUMENTS

| | | | |
|---|---|---|---|
| 6,538,272 B2 * | 3/2003 | Yamazaki et al. .......... 257/295 |
| 6,583,507 B1 * | 6/2003 | Moon et al. ................. 257/751 |
| 6,730,951 B2 * | 5/2004 | Nagano et al. ............. 257/296 |
| 6,734,477 B2 | 5/2004 | Moise et al. | |
| 6,818,935 B2 * | 11/2004 | Kweon et al. .............. 257/295 |
| 6,963,097 B2 * | 11/2005 | Kweon ....................... 257/295 |
| 2002/0142488 A1 * | 10/2002 | Hong ............................ 438/3 |
| 2004/0235259 A1 * | 11/2004 | Celii et al. .................. 438/396 |
| 2005/0101085 A1 * | 5/2005 | Ito et al. ..................... 438/244 |
| 2005/0106759 A1 * | 5/2005 | Hilliger et al. ................ 438/3 |
| 2006/0118841 A1 * | 6/2006 | Eliason et al. ............. 257/295 |
| 2006/0134808 A1 * | 6/2006 | Summerfelt et al. .......... 438/3 |

FOREIGN PATENT DOCUMENTS

JP 2003-110095 4/2003

* cited by examiner

*Primary Examiner*—Kenneth Parker
*Assistant Examiner*—Jesse A. Fenty
(74) *Attorney, Agent, or Firm*—Harness, Dickey & Pierce, P.L.C.

(57) ABSTRACT

A semiconductor memory device includes a substrate having a semiconductor element formed thereon, an interlayer dielectric layer formed above the substrate, a plug formed in the interlayer dielectric layer, an adhesion layer formed in a region including a region above the plug, and a ferroelectric capacitor formed above the adhesion layer and having a lower electrode, a ferroelectric layer and an upper electrode, wherein an oxidized layer is formed in a part of the adhesion layer at a side wall thereof.

6 Claims, 4 Drawing Sheets

SEMICONDUCTOR MEMORY DEVICE AND METHOD FOR MANUFACTURING THE SAME

The entire disclosure of Japanese Patent Application No. 2004-380990, filed Dec. 28, 2004 is expressly incorporated by reference herein.

BACKGROUND

1. Technical Field

The present invention relates to semiconductor memory devices and methods for manufacturing the same.

2. Related Art

It is important for semiconductor memory devices to prevent their plugs that electrically connect ferroelectric capacitors to semiconductor elements on a substrate from oxidation. A barrier layer composed of aluminum oxide or the like may be formed on side surfaces of a ferroelectric capacitor to prevent oxygen from penetrating the ferroelectric capacitor through its side. For example, JP-A-2003-110095 describes an example of related art. However, as the layer is additionally formed on the ferroelectric capacitor, a film forming step and a step of patterning the film are added, which complicates the manufacturing process. Also, as the barrier layer is additionally provided, the size of the ferroelectric capacitor becomes larger, which interferes with device miniaturization.

SUMMARY

In accordance with an advantage of some aspects of the present invention, a semiconductor memory device and a method for manufacturing the same, which can prevent oxidation of plugs and realize simplification of the manufacturing process and device miniaturization, are provided.

In accordance with an embodiment of the invention, a semiconductor memory device includes a substrate having a semiconductor element formed thereon, an interlayer dielectric layer formed above the substrate, a plug formed in the interlayer dielectric layer, an adhesion layer formed in a region including a region above the plug, and a ferroelectric capacitor formed above the adhesion layer and having a lower electrode, a ferroelectric layer and an upper electrode, wherein an oxidized layer is formed in a part of the adhesion layer at a side wall thereof.

According to an aspect of the embodiment, an oxidized layer is formed in a part of the adhesion layer at a side wall thereof. By this, penetration of oxygen through the side wall of the adhesion layer can be prevented by the oxidized layer. For this reason, when, for example, a high-temperature heat processing in an oxygen atmosphere is conducted, the plug can be effectively prevented from being oxidized. Also, compared to the case where an oxidation prevention layer (for example, an aluminum oxide layer) is additionally formed on a ferroelectric capacitor, the size of the ferroelectric capacitor in accordance with the present embodiment does not become larger, and the semiconductor device can be miniaturized. Moreover, because an additional oxidation prevention layer is not required, the device structure can be simplified.

It is noted that, in the present embodiment, the case where a layer B is formed above a specific layer A includes a case where a layer B is directly formed on a layer A, and a case where a layer B is provided above a layer A through another layer. This similarly applies to other embodiments of the invention to be described below.

(2) In the semiconductor memory device, an upper surface of the adhesion layer may have an area that is generally the same as a lower surface of the lower electrode.

(3) In the semiconductor memory device, the adhesion layer may be composed of a conductive material including aluminum, and the oxidized layer may include aluminum oxide.

For example, the adhesion layer may be formed from titanium aluminum nitride.

(4) In the semiconductor memory device, the adhesion layer may include a first adhesion layer formed above the plug, and a second adhesion layer that has a plane configuration greater than the first adhesion layer and is formed above and on a side of the first adhesion layer, wherein the oxidized layer may be formed in a part of the second adhesion layer at a side wall thereof (5) In the semiconductor memory device, the first adhesion layer may be composed of a material with a lower resistance than the second adhesion layer.

(6) In the semiconductor memory device, the first adhesion layer may be a titanium nitride layer, and the second adhesion layer may be a titanium aluminum nitride layer.

(7) In accordance with another embodiment of the invention, a method for manufacturing a semiconductor memory device includes (a) forming an interlayer dielectric layer above a substrate having a semiconductor element formed thereon, (b) forming a plug in the interlayer dielectric layer, (c) forming in a region including a region above the plug a laminated body including an adhesion layer, a lower electrode, a ferroelectric layer and an upper electrode, (d) forming a ferroelectric capacitor by patterning the laminated body, and (e) forming an oxidized layer in a portion of the adhesion layer at a side wall thereof by conducting an anneal treatment in an oxygen atmosphere.

In accordance with an aspect of the embodiment described above, an anneal treatment is conducted on the formed ferroelectric capacitor in an oxygen atmosphere, whereby an oxidized layer is formed in a part of the adhesion layer at a side wall thereof. By this, penetration of oxygen through the side wall of the adhesion layer can be prevented by the oxidized layer. For this reason, even when a high-temperature heat processing in an oxygen atmosphere is further conducted in a later step, the plug can be effectively prevented from oxidation. Also, compared to the case where an oxidation prevention layer (for example, an aluminum oxide layer) is additionally formed on a ferroelectric capacitor, the size of the ferroelectric capacitor in accordance with the present embodiment does not become larger, and further miniaturization of the semiconductor memory device can be achieved. Moreover, because a film forming step or a patterning step for additionally forming an oxidation prevention layer is not required, the manufacturing process can be simplified.

DESCRIPTION OF EXEMPLARY EMBODIMENTS

Preferred embodiments of the invention are described below with reference to the accompanying drawings.

FIGS. 1 through 6 are views showing a method for manufacturing a semiconductor memory device (ferroelectric memory device) in accordance with an embodiment of the present invention.

Figure 1:
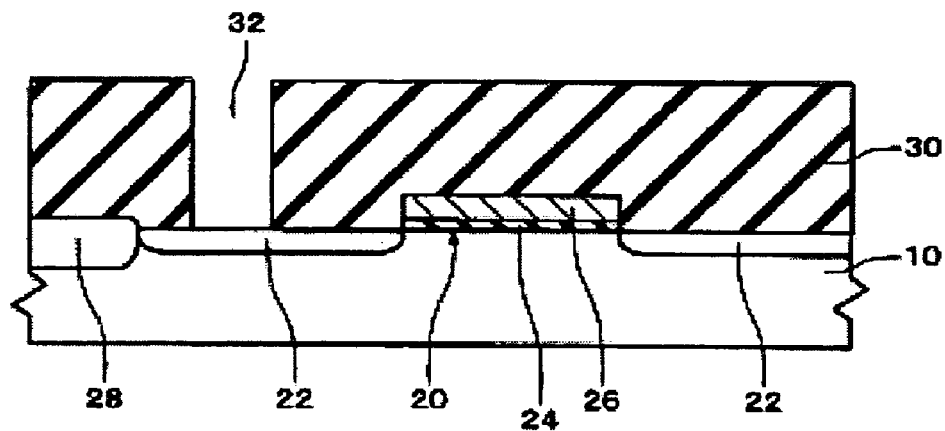
FIG. 1 is a view showing a method for manufacturing a semiconductor memory device in accordance with an embodiment of the invention.

(1) As shown in FIG. 1, a substrate 10 is prepared. The substrate is a semiconductor substrate (a semiconductor wafer), and has a plurality of semiconductor elements 20 formed therein. The semiconductor element 20 includes a diffusion region 22 that becomes to be a source region or a drain region, a gate dielectric layer 24, and a gate electrode 26. An element isolation region 28 is provided between adjacent ones of the semiconductor elements 20. In accordance with the present embodiment, a stacked structure type semiconductor memory device of a 1T1C type is manufactured as an example.

First, an interlayer dielectric layer 30 is formed on the substrate 10. The interlayer dielectric layer 30 may be formed from, for example, silicon oxide ($SiO_2$) or TEOS-$SiO_2$. The interlayer dielectric layer 30 is formed on a surface of the substrate 10 in which the semiconductor elements 20 are formed. The interlayer dielectric layer 30 may be formed to cover the entire upper surface of the substrate 10. A known technology, such as, for example, a CVD (Chemical Vapor Deposition) method can be used as the film forming method. An upper surface of the interlayer dielectric layer 30 may be planarized by a CMP (Chemical Mechanical Polishing) method or the like.

As shown in FIG. 1, a hole 32 is formed in the interlayer dielectric layer 30. The hole 32 defines a contact hole for electrically connecting a ferroelectric capacitor 70 and a semiconductor element 20 (the diffusion region 22 in FIG. 1). In other words, a part of the semiconductor element 20 (for example, the diffusion region 22) is exposed through the hole 32. The hole 32 may be formed by a dry etching method.

Figure 2:
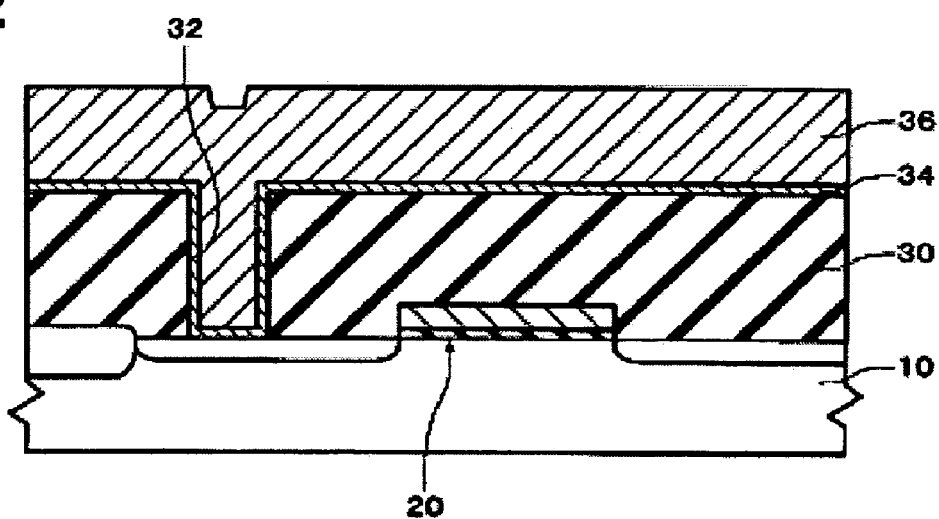
FIG. 2 is a view showing the method for manufacturing a semiconductor memory device in accordance with the embodiment of the invention.
Figure 3:
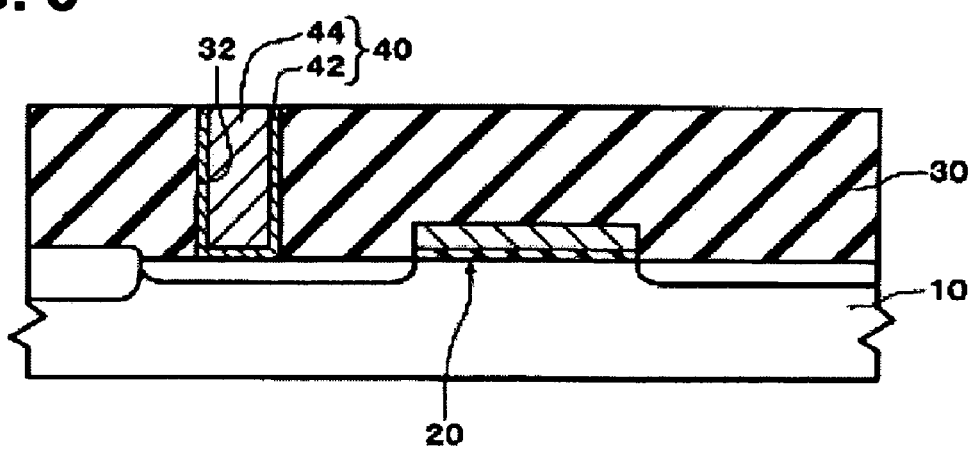
FIG. 3 is a view showing the method for manufacturing a semiconductor memory device in accordance with the embodiment of the invention.

(2) Next, as shown in FIG. 2 and FIG. 3, a plug 40 is formed in the interlayer dielectric layer 30. The plug 40 electrically connects the ferroelectric capacitor 70 and the semiconductor element 20 (see FIG. 6).

First, as shown in FIG. 2, a barrier layer 34 is formed in a region including an inner surface of the hole 32. The barrier layer 34 may be formed by a film forming method, such as, for example, a sputtering method. The barrier layer 34 is formed on an inner surface of the hole 32 in a manner not to embed the hole 32. The barrier layer 34 may be formed from at least one of a titanium (Ti) layer and a titanium nitride (TiN) layer.

Next, a conductive layer 36 is formed in a region (on the barrier layer 34) including the inner surface of the hole 32. The conductive layer 36 may be formed in a manner to embed the interior of the hole 32 (more specifically, the interior surrounded by the barrier layer 34). The conductive layer 36 may be formed by a CVD method. The conductive layer 36 may be formed from, for example, tungsten (W).

Then, as shown in FIG. 3, the conductive layer 36 and the barrier layer 34 are etched or polished, thereby forming the plug 40 (including a barrier layer 42 and a conductive layer 44 after polishing). For this polishing step, an etch-back or a CMP method can be applied. More specifically, the conductive layer 36 and the barrier layer 34 are etched or polished until a surface of the interlayer dielectric layer 30 is exposed. In this manner, the plug 40 can be formed in the hole 32.

Figure 4:
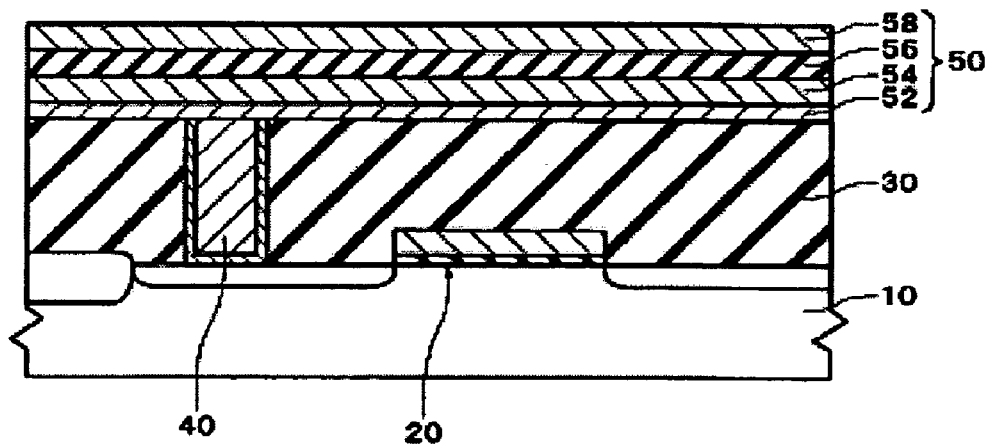
FIG. 4 is a view showing the method for manufacturing a semiconductor memory device in accordance with the embodiment of the invention.

(3) As shown in FIG. 4, a laminated body 50 including an adhesion layer 52, a lower electrode 54, a ferroelectric layer 56 and an upper electrode 58 is formed.

The adhesion layer 52 may be formed from a conductive material containing aluminum (Al), and can be formed from, for example, a titanium aluminum nitride (TiAlN). The adhesion layer 52 may be formed from a single layer or a plurality of layers (see a modified example to be described below). If a recess occurs in the plug 40, a part of the adhesion layer 52 may be provided inside the hole 32 to eliminate the recess.

A lower electrode 54, a ferroelectric layer 56 and an upper electrode 58 are successively laminated on the adhesion layer 52. The lower electrode 54 may be formed from, for example, Pt, Ir, Ir oxide ($IrO_x$), Ru, Ru oxide ($RuO_x$), SrRu compound oxide ($SrRuO_x$) or the like. The lower electrode 54 may be formed from a single layer or a plurality of layers. In the case of a plurality of layers, the lower electrode 54 may include an Ir layer, an $IrO_x$ layer and Pt layer successively laminated on the adhesion layer 52. As the method for forming the lower electrode 54, a sputtering method, a vacuum vapor deposition method, a CVD method or the like can be applied.

The ferroelectric layer 56 may be formed from a PZT type ferroelectric material composed of oxides including Pb, Zr and Ti as constituting elements. Alternatively, Pb (Zr, Ti, Nb) $O_3$ (PZTN type) in which Nb is doped at the Ti site may be used. Alternatively, without being limited to the aforementioned materials, any of other materials, such as, for example, SBT type, BST type, BIT type and BLT type may be used. As the method for forming the ferroelectric layer 56, a solution coating method (including a sol-gel method, a MOD (Metal Organic Decomposition) method or the like), a sputtering method, a CVD (Chemical Vapor Deposition) method, a MOCVD (Metal Organic Chemical Vapor Deposition) method or the like can be applied.

It is noted that the upper electrode 58 may be formed by using the materials and method described above for the lower electrode 54.

Figure 5:
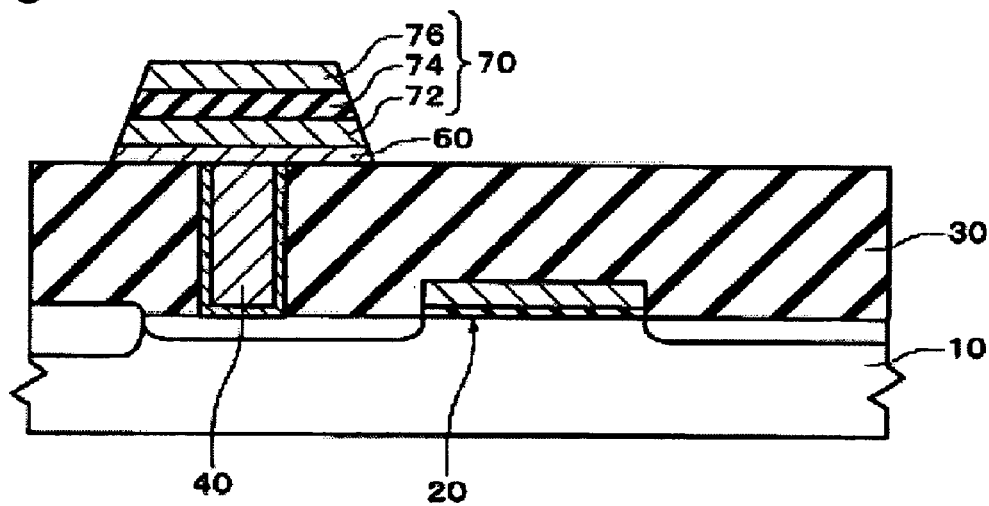
FIG. 5 is a view showing the method for manufacturing a semiconductor memory device in accordance with the embodiment of the invention.

(4) As shown in FIG. 5, by patterning the laminated body 50, an adhesion layer 60 and a ferroelectric capacitor 70 are formed.

The patterning step may be conducted by using a photolithography technique and an etching (dry etching or wet etching) technique. In the patterning step, the entire laminated body 50 may be patterned together. In other words, all of the adhesion layer 52, the lower electrode 54, the ferroelectric layer 56 and the upper electrode 58 may be patterned at the same time. In this case, each of the layers has generally the same plane configuration, and for example, an upper surface of the adhesion layer 60 (the surface on the side of the ferroelectric capacitor 70) has generally the same area as that of a lower surface of the lower electrode 72 (the surface on the side of the adhesion layer 60). The ferroelectric capacitor 70 and the adhesion layer 60 after patterning may have side surfaces that are tapered to become wider toward an end thereof Alternatively, the patterning step may be conducted sequentially for portions of the laminated body 50 in different steps. In this case, any one of the layers among the upper electrode 76, the ferroelectric layer 74, the lower electrode 72 and the adhesion layer 60 may be formed to have a plane configuration different from those of the other layers.

Figure 6:
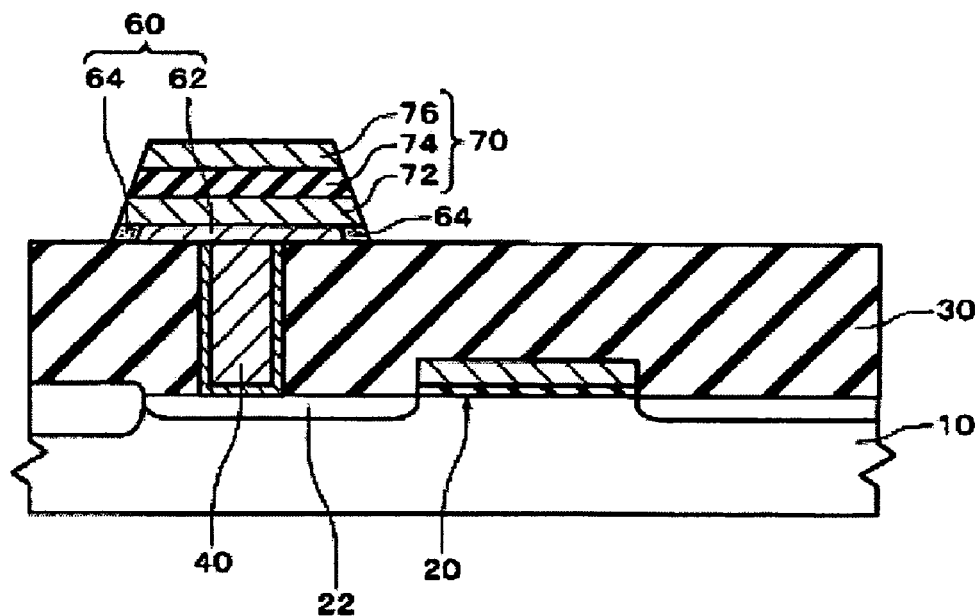
FIG. 6 is a view showing a semiconductor memory device manufactured by the method for manufacturing a semiconductor memory device in accordance with the embodiment of the invention.

(5) As shown in FIG. 6, an anneal treatment in an oxygen atmosphere is conducted. As a result, an oxidized layer 64 is formed in a part of the adhesion layer 60 at its side surface. The annealing temperature is not particularly limited, and for example, may be about 550° C.-750° C. (for example, 700° C.). The anneal treatment may also be used to recover the ferroelectric capacitor 70 from damages caused by etching.

When the anneal treatment in an oxygen atmosphere is conducted, the aluminum content included in the adhesion layer 60 is oxidized, and an aluminum oxide layer ($AlO_x$ layer) is formed in a portion of the adhesion layer 60 which is exposed at its side surface. For example, when the adhesion layer 60 is composed of titanium aluminum nitride (for example, with a composition ratio being $Ti_{0.6}Al_{0.4}N$), the composition ratio of titanium becomes generally halved and the composition ratio of aluminum becomes generally doubled at the side wall of the adhesion layer 60 as a result of conducting the anneal treatment. When the temperature of the anneal treatment is high, a thick oxidized layer 64 can be formed at the side wall of the adhesion layer 60. Also, by forming the oxidized layer 64 from an aluminum oxide layer, higher oxidation resistance can be secured, compared to, for example, a $TiO_x$ layer formed by oxidizing a titanium nitride (TiN layer) without containing aluminum.

The adhesion layer 60 after the anneal treatment includes an inner conductive layer 62 and an oxidized layer 64 that is provided around the conductive layer 62 and is exposed at the side wall. The oxidized layer 64 is formed along the entire circumference of the adhesion layer 60. It is noted that the oxidized layer 64 refers to a region having a higher oxygen content compared to the inner conductive layer 62, and is not limited to a region that is completely oxidized.

In this manner, as shown in FIG. 6, a semiconductor memory device including the ferroelectric capacitor 70 can be manufactured. The semiconductor memory device includes the substrate 10, the interlayer dielectric layer 30, the plug 40 formed in the interlayer dielectric layer 30, the adhesion layer 60 formed in a region including a region above the plug 40, and the ferroelectric capacitor 70 formed above the adhesion layer 60. The oxidized layer 64 is formed in a part of the adhesion layer 60 at its side surface. Other details of the semiconductor memory device can be derived from the contents of the manufacturing method described above, and therefore descriptions thereof are omitted.

According to the present embodiment, after the ferroelectric capacitor 70 has been formed, an anneal treatment in an oxygen atmosphere is conducted, thereby forming the oxidized layer 64 in a part of the adhesion layer 60 at its side surface. By this, penetration of oxygen through the side wall of the adhesion layer 60 can be prevented by the oxidized layer 64. For this reason, even when a high-temperature heat-processing in an oxygen atmosphere is further conducted in a later step, oxidation of the plug 40 can be effectively prevented. Also, compared to the case where an oxidation prevention layer (for example, an aluminum oxide layer) is additionally formed on a ferroelectric capacitor 70, the size of the ferroelectric capacitor in accordance with the present embodiment does not become larger, and the semiconductor memory device can be further miniaturized. Moreover, because a film forming step and a patterning step for additionally forming an oxidation prevention layer are not required, the manufacturing process can be simplified.

Figure 7:
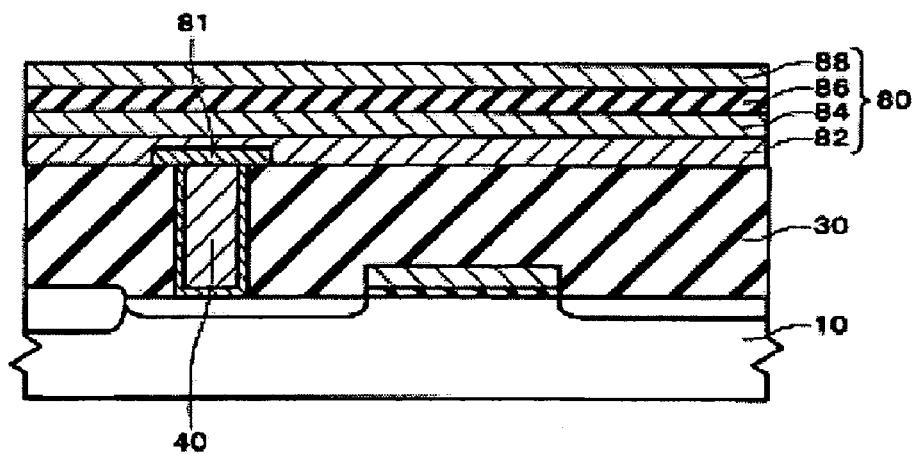
FIG. 7 is a view showing a method for manufacturing a semiconductor memory device in accordance with a modified example of the embodiment of the invention.
Figure 8:
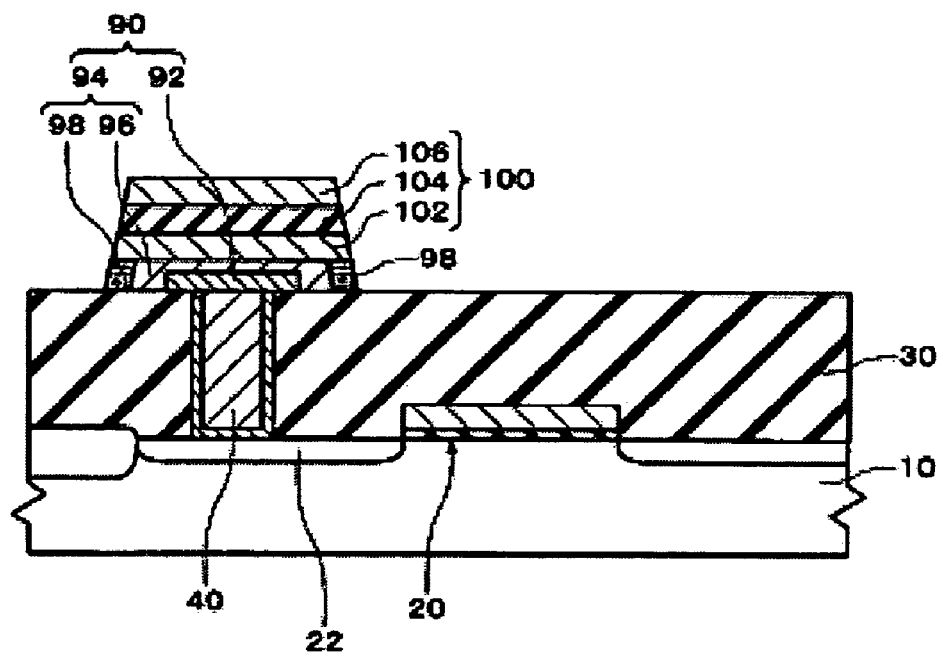
FIG. 8 is a view showing a semiconductor memory device manufactured by the method for manufacturing a semiconductor memory device in accordance with the modified example of the embodiment of the invention.

FIG. 7 and FIG. 8 are views showing a method for manufacturing a semiconductor memory device in accordance with a modified example of the embodiment of the invention. The modified example is different from the above-described embodiment in that an adhesion layer 90 is formed from a plurality of layers (first and second adhesion layers 92 and 94).

As shown in FIG. 7, a laminated body 80 including a first adhesion layer 81, a second adhesion layer 82, a lower electrode 84, a ferroelectric layer 86 and an upper electrode 88 is formed in a region including a region above a plug 40. More specifically, after the first adhesion layer 81 has been patterned in a predetermined shape, the second adhesion layer 82 is formed in a manner to cover the first adhesion layer 81, and then the lower electrode 84, the ferroelectric layer 86 and the upper electrode 88 are laminated on the second adhesion layer 82.

Next, as shown in FIG. 8, by patterning the laminated body 80, an adhesion layer 90 and a ferroelectric capacitor 100 are formed. The second adhesion layer 94 is formed to have a plane configuration larger than that of the first adhesion layer 92, and to be located above and on a side of the first adhesion layer 92. In other words, the second adhesion layer 94 entirely covers the first adhesion layer 92.

Then, an anneal treatment in an oxygen atmosphere is conducted, thereby forming an oxidized layer 98 in a part of the second adhesion layer 94 at its side wall. The adhesion layer 90 after the anneal treatment includes a first adhesion layer 92, and a second adhesion layer 94 provided around the first adhesion layer 92. Also, the second adhesion layer 94 includes an inner conductive layer 96, and an oxidized layer 98 that is provided around the conductive layer 96 and is exposed at a side wall thereof.

The first adhesion layer 92 may be formed from a material with a lower resistance than that of the second adhesion layer 94. For example, the first adhesion layer 92 may be formed from a titanium nitride (TiN), and the second adhesion layer 94 may be formed from a titanium aluminum nitride (TiAlN). By this, a lower resistance can be achieved by the first adhesion layer 92, and the oxygen barrier function can be improved by the second adhesion layer 94 that includes aluminum (Al). It is noted that, in the conductive layer 96 of the second adhesion layer 94, the thickness thereof above the first adhesion layer 92 may be thinner than the thickness of the first adhesion layer 92. By this, a lower resistance in a current path of the ferroelectric capacitor 100 can be achieved.

It is noted that other details of the present modified example can be derived from the contents of the above-described embodiment, and therefore descriptions thereof are omitted.

The present invention is not limited to the embodiments described above, and many modifications can be made. For example, the invention may include compositions that are substantially the same as the compositions described in the embodiments (for example, a composition with the same function, method and result, or a composition with the same objects and result). Also, the invention may include compositions in which portions not essential in the compositions described in the embodiments are replaced with others. Also, the invention may include compositions that achieve the same functions and effects or achieve the same objects of those of the compositions described in the embodiments. Furthermore, the invention may include compositions that include publicly known technology added to the compositions described in the embodiments.

What is claimed is:

1. A semiconductor memory device comprising:
    a substrate having a semiconductor element formed thereon;
    an interlayer dielectric layer formed above the substrate, the interlayer dielectric layer having a hole formed therein;
    a barrier layer formed on an inner surface of the hole;
    a plug embedded in an interior of the hole in the interlayer dielectric layer;
    an adhesion layer containing aluminum formed in direct contact with the plug;
    a ferroelectric capacitor formed above the adhesion layer and having a lower electrode, a ferroelectric layer and an upper electrode; and
    an aluminum oxide layer formed about a circumference of the adhesion layer from a part of the adhesion layer at a side wall thereof.

2. A semiconductor memory device according to claim 1, wherein an upper surface of the adhesion layer and a lower surface of the lower electrode have generally the same area.

3. A semiconductor memory device according to claim 1, wherein the adhesion layer is composed of a conductive material.

4. A semiconductor memory device according to claim 1, wherein the adhesion layer includes a first adhesion layer formed above the plug, and a second adhesion layer formed above and on a side of the first adhesion layer, wherein the aluminum oxide layer is formed in a part of the second adhesion layer at a side wall thereof.

5. A semiconductor memory device according to claim 4, wherein the first adhesion layer is composed of a material with a lower resistance than the second adhesion layer.

6. A semiconductor memory device according to claim 4, wherein the first adhesion layer is a titanium nitride layer, and the second adhesion layer is a titanium aluminum nitride layer.

* * * * *